United States Patent [19]
Thewes et al.

[11] Patent Number: 5,831,892
[45] Date of Patent: Nov. 3, 1998

[54] MATRIX MEMORY IN VIRTUAL GROUND ARCHITECTURE

[75] Inventors: Roland Thewes, Groebenzell; Paul-Werner von Basse, Wolfratshausen; Michael Bollu, Munich; Doris Schmitt-Landsiedel, Ottobrunn, all of Germany

[73] Assignee: Siemens Aktiengesellschaft, Munich, Germany

[21] Appl. No.: 904,373

[22] Filed: Aug. 1, 1997

[30] Foreign Application Priority Data

Aug. 1, 1996 [DE] Germany .................. 196 31 169.1

[51] Int. Cl.[6] .................. G11C 17/00; G11C 17/34
[52] U.S. Cl. .................. 365/94; 365/104; 365/185.16; 365/185.17; 365/185.24
[58] Field of Search .................. 365/94, 100, 104, 365/185.05, 185.16, 185.17, 185.24

[56] References Cited

U.S. PATENT DOCUMENTS 5,204,835  4/1993  Eitan .................. 365/185.16

*Primary Examiner*—David C. Nelms
*Assistant Examiner*—Trong Phan
*Attorney, Agent, or Firm*—Hill & Simpson

[57] ABSTRACT

A matrix memory with improved virtual ground architecture and evaluation circuit from which the informational content of two neighboring memory cells can be simultaneously read at a bit line during a read event. The memory cells with information "0" are realized, for example, by a respective field effect transistor with low threshold voltage. Every bit line provided for the readout is connected to the drain terminals of two neighboring field effect transistors in the same row. The source terminals are applied to one of two potentials that differ from one another. Depending upon which of the field effect transistors is conductive upon selection of the pertinent word line, different resultant potentials are obtained on the bit line. Such potentials are then converted in the evaluation circuit into binary signals that represent the read information.

11 Claims, 4 Drawing Sheets

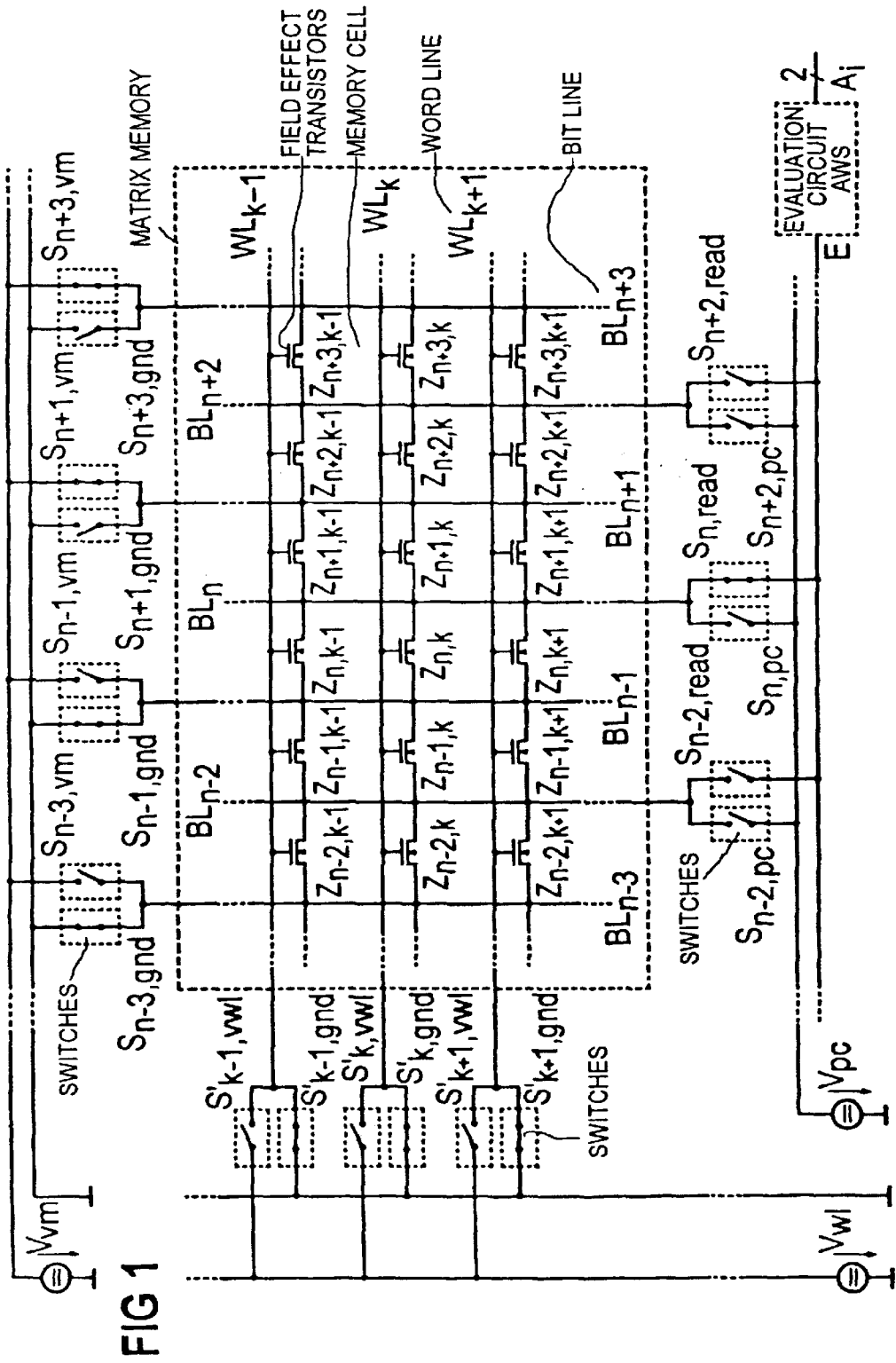

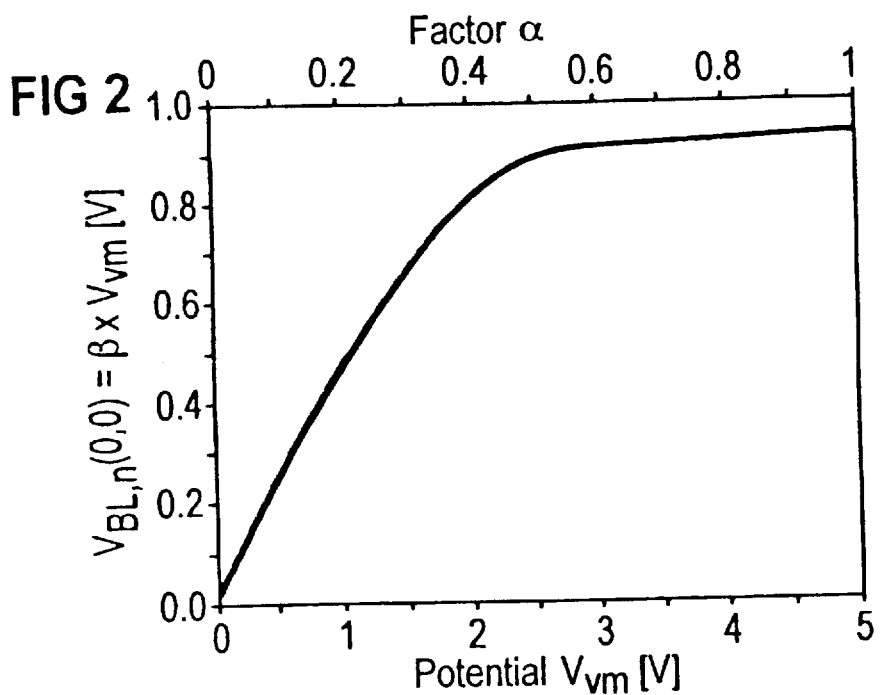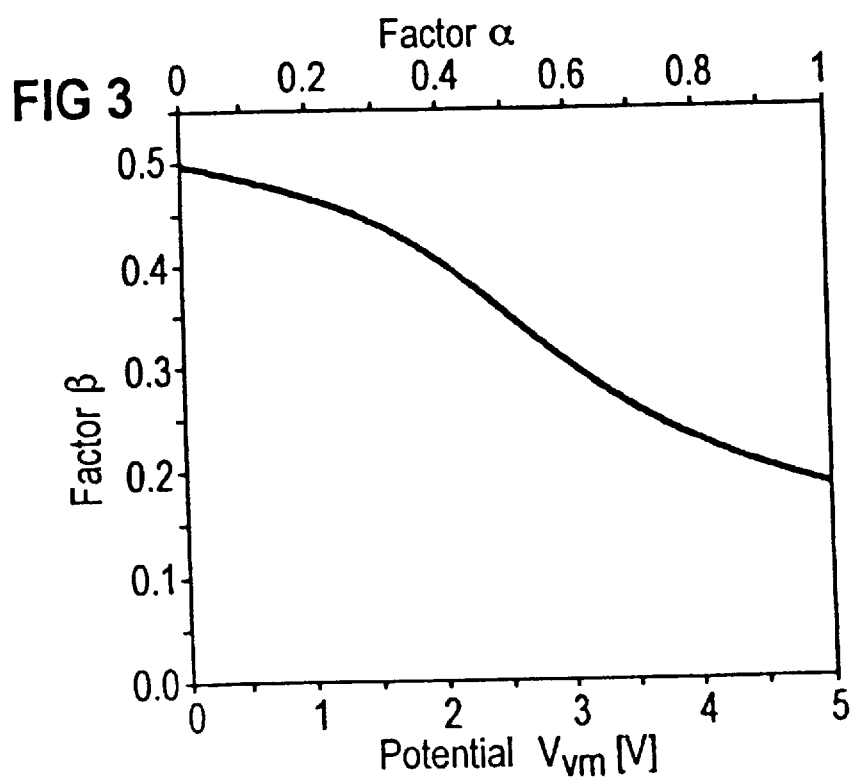

FIG 6
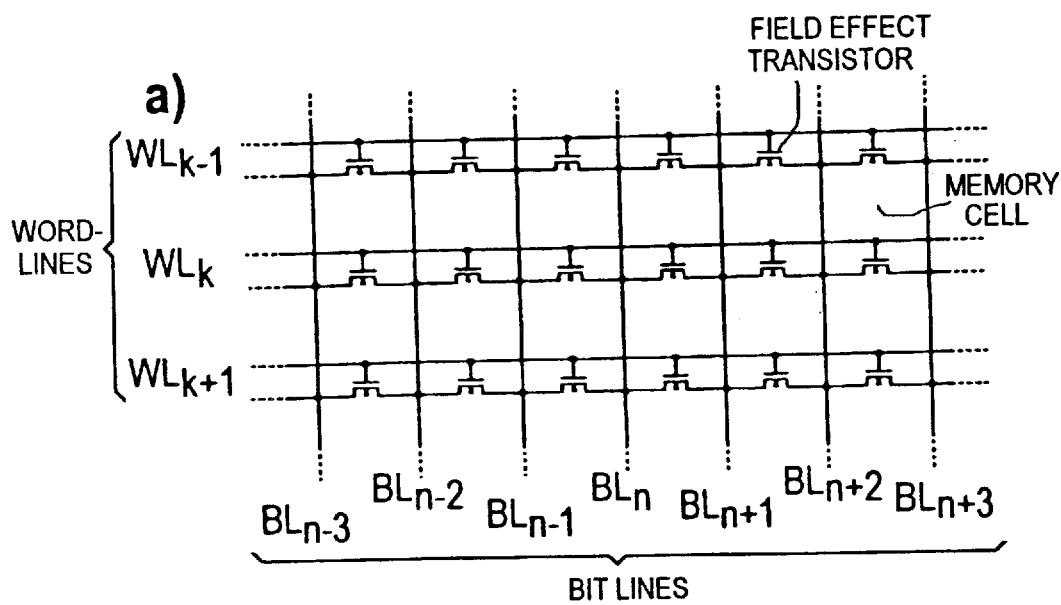
a)
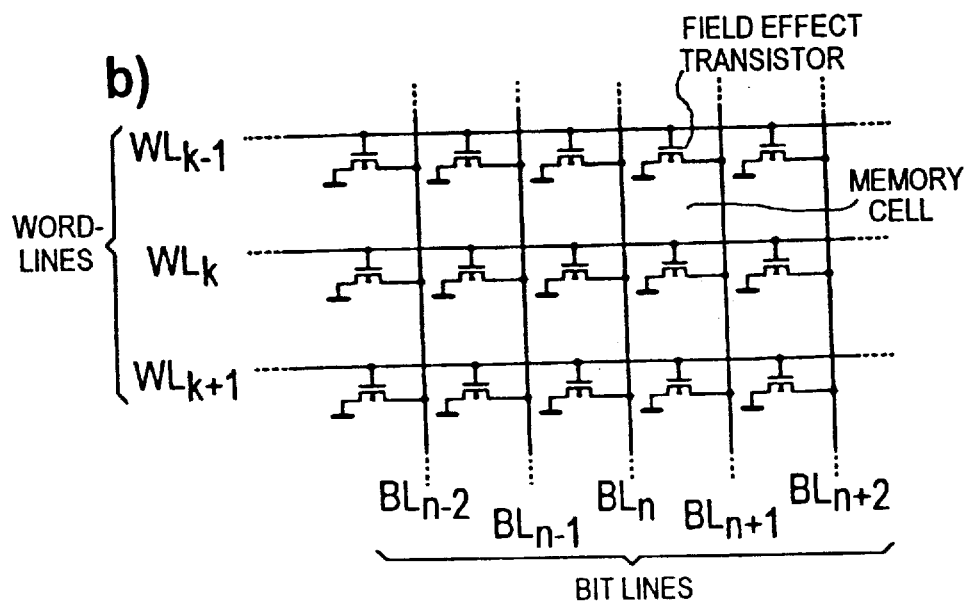
b)

MATRIX MEMORY IN VIRTUAL GROUND ARCHITECTURE

BACKGROUND OF THE INVENTION

1. Field of the Invention

The present invention is directed to a matrix memory with an improved virtual ground architecture and evaluation circuit from which the informational content of two neighboring memory cells can be simultaneously read at a bit line during a read event, thus enabling a fundamental shortening of the duration of such read event.

2. Description of the Prior Art

The area requirement of memory cell fields in ROM structures is determined by the size of the actual memory cell that, for example, can be implemented as a mask-programmed transistor, as a floating gate cell or the like, and by the space requirement of the leads to the memory cells. In order to achieve an increase in storage capacity per chip area given a predetermined cell size, the area requirement of the leads must be reduced. Such reduction is achieved by what is referred to as virtual ground architecture of the cell field as disclosed, for example, in the publications by B. Eitan et al. in IEEE Electron Device Letters 12, 450–452 (1991), in IEDM 91, 311–314 (1991) and in 1993 VLSITSA, 336–338 (1993).

With virtual ground architecture, the storage transistors have their source and drain terminals at the commonly used bit lines ($Bl_n$), as shown in FIG. 6a. In conventional arrangements, conversely, the drain terminal lies at a bit line but the source terminal lies at ground (See FIG. 6b). Leaving other factors out of consideration, the speed of the read event is essentially defined by the selection process which occurs within the memory cell field and the determining time constant thereof. The duration of a read access process is one of the most important parameters that characterizes the properties of a memory. To date, in order to increase this read speed, measures have been taken which either reduce the parasitic capacitances and resistances of the memory cells or increase the current-driving capability of the storage transistors.

SUMMARY OF THE INVENTION

An object of the present invention is to specify a matrix memory that enables a fundamental shortening of the duration of the read events. This object is achieved with a matrix memory having an improved virtual ground architecture and evaluation circuit from which the informational content of two neighboring memory cells can be simultaneously read at a bit line during a read event. Memory cells with information "0" are realized, for example, by a respective field effect transistor with low threshold voltage. Every bit line provided for the readout is connected to the drain terminals of two neighboring field effect transistors in the same row. The source terminals are applied to one of two potentials which differ from each other. Depending on which of the two field effect transistors is conductive upon selection of the pertinent word line, different potentials are obtained on the bit line. Such potentials are then converted in the evaluation circuit into binary signals that represent the read information.

More specifically, a readout circuit is provided in the inventive matrix memory that makes it possible to simultaneously evaluate the informational content of two neighboring memory cells during a read event at a bit line. The bit line at which the readout occurs thereby represents the common node of the two pertinent memory cells at a selected word line. The memory cells become conductive upon selection of the pertinent word line which, in turn, is dependent on whether a logical "0" or "1" is stored in the cell. What status is considered "0" or "1" is basically discretionary. In the following descriptions and in the claims, a logical "0" is assigned to a cell that becomes conductive upon the application of a suitable potential at the pertinent word line.

Such a cell is fundamentally established by a controllable resistor as realized by, for example, a field effect transistor. A difference in potential between a first and a second terminal of this resistor is equalized when, upon the application of a suitable potential to a third terminal, the value of this resistor is reduced to an adequate extent. In case no such resistor is present in a cell or the value of this resistor is not reduced or not adequately reduced, a difference in potential between the first and the second terminal is maintained, at least during the time provided for a read event. The information of the cell is then a logical "1" corresponding to the classification undertaken here. When a bit line provided for the readout is connected to the first terminals of two such resistors neighboring in the same row and the second terminals of these resistors lie at one of two potentials differing from one another, different resultant potentials are obtained on the bit line depending on the information present on the bit line, given the selection of the word line leading to these two resistors. As a result, the potential on this bit line simultaneously provides the information of two memory cells.

Additional features and advantages of the present invention are described in, and will be apparent from, the detailed description of the presently preferred embodiments and from the drawings.

DESCRIPTION OF THE DRAWINGS

FIG. 1 shows a schematic diagram of a matrix memory in accordance with the principles of the present invention.

FIG. 2 graphically shows the factor $V_{BL}$ as a function of $V_{VM}$.

FIG. 3 graphically shows the factor $\beta$ as a function of $V_{VM}$.

FIG. 6a shows a storage transistor arrangement with virtual ground architecture (prior art).

FIG. 6b shows a conventional storage transistor arrangement (prior art).

DETAILED DESCRIPTION OF THE PREFERRED EMBODIMENTS

Figure 4:
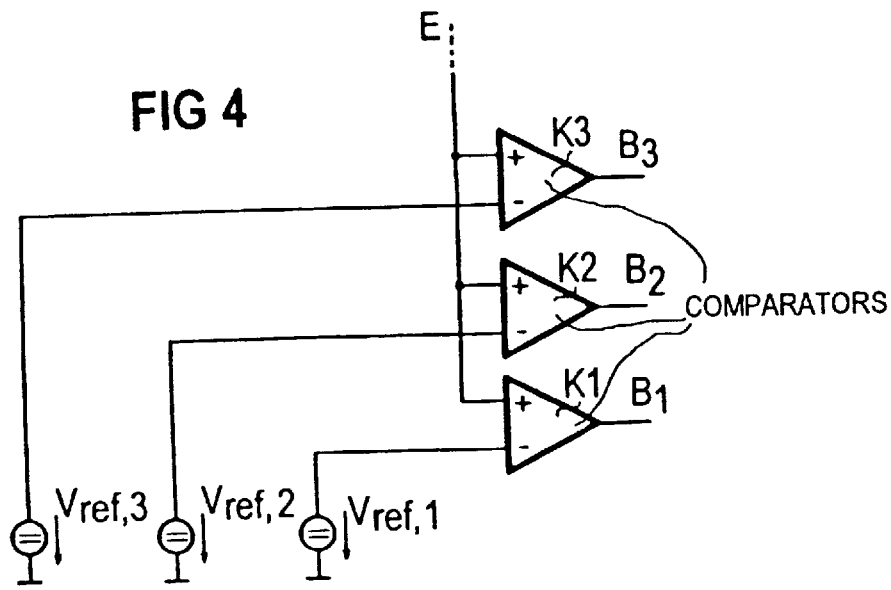
FIG. 4 shows a schematic diagram of one embodiment of an evaluation circuit in accordance with the principles of the present invention.

Turning to FIG. 1, the columns of the memory cell arrangement are numbered in ascending order from left to right and the rows of the arrangement are numbered in ascending order from top to bottom. Such numbering could begin with an arbitrary number and at an arbitrary side of the memory cell field as well. The memory cells are referenced in the form $Z_{n,k}$ wherein the first index ($_n$) references the number of the column or, respectively, the number of a neighboring bit line $BL_n$. The second index ($_k$) references the number of the row or, respectively, the number of a neighboring word line $WL_k$. The information of memory cells which are neighboring in a row, $Z_{n,k}$ and $Z_{n+1,k}$, for example, should be read at the common bit line $BL_n$.

The information of a memory cell should correspond to a logical "1" when no storage transistor is present or when an existing field effect transistor exhibits a very high threshold voltage lying above the operating potential $V_{DD}$ (positive here) of the circuit. The information of a memory cell should correspond to logical "0" when a field effect transistor is present or, differing from the other transistors, when the field effect transistor exhibits a low threshold voltage. The first of the aforementioned possibilities relates, for example, to mask-programmed ROMs. The second possibility relates, for example, to EPROMs and modifications of mask-programmed ROMs. The second possibility is realized in the exemplary embodiment shown in FIG. 1.

The informational content of the memory cell $Z_{n,k}$ is referenced below with the corresponding Boolean variable $Z_{n,k}$ that has a value of "0" or "1." In the exemplary embodiment to be described, a "1" shall represent a high potential which is identical to the positive operating potential $V_{DD}$ of the overall circuit here. A "0" shall represent a low potential which is identical with the ground potential $V_{gnd}$ of the overall circuit here.

When the informational contents of the memory cells $Z_{n,k}$ and $Z_{n+1,k}$ of the arrangement of FIG. 1 are to be read out for a specific n and a specific k, the bit line $BL_n$ shared by these cells is precharged to the potential $V_{pc}$. This potential $V_{pc}$ is the drain potential resulting from the employment of n-channel MOSFETs in the cells. The values which come into consideration for this potential are derived from the following explanation of the read event. In many instances, it is practical to select this potential $V_{pc}$ equal to the positive operating potential $V_{DD}$.

Switches $S_n$ for the bit lines are provided so that the bit lines can be sequentially connected into the potential $V_{pc}$ or, alternating in time, to one of two different lower potentials, referenced $V_{vm}$ and $V_{gnd}$ here. When precharging the bit line $BL_n$ (specific n), the switch $S_{n,pc}$ is closed. At the same time, all other switches $S_{n+2m,pc}$ are opened, with a whole-numbered m unequal to 0. The switches $S_{n+2m,read}$, with a whole-numbered m, which are provided for forwarding the information that is read out for the evaluation, are likewise opened.

The source terminal of the transistor in cell $Z_{n,k}$ is connected to the potential $V_{gnd}$ via the switch $S_{n-1,gnd}$ and the bit line $BL_{n-1}$. The source terminal of the transistor in cell $Z_{n+1,k}$ is connected to the potential $V_{vm}$ via the switch $S_{n+1,vm}$ and the bit line $BL_{n+1}$. The other switches $S_{n+1+2m,gnd}$ with a whole-numbered m unequal to $-1$ and $S_{n+1+2m,vm}$ with a whole-numbered m unequal to 0 are, for example, opened. For reasons of an optimally simple algorithm for driving the memory cell field and for reasons of the dissipated power balance, it is meaningful to connect all bit lines $BL_{n-1-2m}$ with m=0, 1, 2, 3, 4, . . . , to $V_{gnd}$ via the switches $S_{n-1-2m,gnd}$, with m=0, 1, 2, 3, 4. It is also meaningful to connect all bit lines $BL_{n+1+2m}$, with m=0, 1, 2, 3, 4, . . . to $V_{vm}$ via the switches $S_{n+1+2m,vm}$, with m=0, 1, 2, 3, 4, . . . , as shown in FIG. 1. For the readout of the cells $Z_{n,k}$ and $Z_{n+1,k}$, however, it is only important that the source terminals of the transistors of these cells are connected to $V_{gnd}$ or, respectively, to $V_{vm}$, wherein these potentials can also be interchanged.

The potential $V_{vm}$ preferably lies between $V_{gnd}$ and $V_{DD}$. Preferred values derive for $V_{vm}=V_{gnd}+\alpha(V_{DD}-V_{gnd})$ when α has a value of at least 0.3 and at most 0.6. The potential $V_{vm}$ is lower than the potential $V_{pcf}$ applied for precharging the bit lines.

Switches $S'_{k,gnd}$ and $S'_{k,vwl}$ are provided with which the word lines $WL_k$ can be connected to the potential $V_{gnd}$ or the potential $V_{wl}$, respectively. During the precharging of the bit line $BL_n$, for example, all switches $S'_{k,gnd}$ are closed and all switches $S'_{k,vwl}$ are open so that all word lines lie at ground potential $V_{gnd}$. After the bit line is precharged, the switches $S_{n,pc}$ and $S'_{k,gn}$, with the specific k of the cells to be read out, are opened and the switches $S_{n,read}$, with the specific n of the cells to be read out, and $S'_{k,vwl}$, with the specific k of the cells to be read out, are closed. The gate terminals of the transistors in the memory cells $Z_{n,k}$ and $Z_{n+1,k}$ to be read out thus lie at the potential $V_{wl}$, which is preferably equal to the operating potential $V_{DD}$ (positive here). In order to make the transistors in the cells with a "0" conductive, the potential $V_{wl}$ is at a distance from both potential $V_{gnd}$ and potential $V_{vm}$ by a spacing of at least the threshold voltage of the pertinent transistors (here, $V_{wl}>V_{vm}+V_{th,0}$, wherein $V_{th,0}$ is the threshold voltage of the transistors that represent a logical "0"). Depending upon whether transistors are present in the cells $Z_{n,k}$ and $Z_{n+1,k}$ or whether the transistors exhibit a low threshold voltage, a specific potential is established on the bit line $BL_n$. Four different values of $V_{BL}(Z_{n,k}, Z_{n+1,k})$ come into consideration for this potential depending upon whether $Z_{n,k}$ and $Z_{n+1,k}$ are 0 or 1:

a) When $Z_{n,k}=Z_{n+1,k}=1$ applies, $BL_n$ remains at the potential $V_{pc}$, i.e. $V_{BL}(1,1)=V_{pc}$. No conductive transistor (between source and drain) is present in the two cells $Z_{n,k}$ and $Z_{n+1,k}$ so that no compensation of the difference in potential between the bit line $BL_n$ and the bit lines $BL_{n-1}$ or $BL_{n+1}$ can occur.

b) When $Z_{n,k}=0$ and $Z_{n+1,k}=1$ applies, the transistor in cell $Z_{n,k}$ is conductive and the bit line $BL_n$ is discharged to the potential $V_{gnd}$ that is adjacent at the source terminal of the transistor in the cell $Z_{n,k}$, i.e. $V_{BL}(0,1)=V_{gnd}$.

c) When $Z_{nk=1}$ and $Z_{n+1,k=0}$ applies, the transistor on cell $Z_{n+1,k}$ B conductive and the bit line $Bl_n$ B discharged to the potential $V_{vm}$ that is adjacent at the source terminal of the transistor in the cell $Z_{n+1,k}$, i.e. $V_{BL}(1,0)=V_{vm}$.

d) When $Z_{n,k}=0$ and $Z_{n+1,k}=0$ applies, the transistors in both cell $Z_{nk}$ and cell $Z_{n+1,k}$ are conductive and the bit line $BL_n$ is discharged to the potential $V_{BL}(0,0)$, referred to below and in the claims as medium potential. This medium potential arises because the conductive transistors in the neighboring cells form a voltage divider. A potential between $V_{vm}$ and $V_{gnd}$ is thereafter present between the transistors. This medium potential does not lie in the middle between $V_{vm}$ and $V_{gnd}$. Rather, this medium potential lies somewhat below $0.5(V_{vm}+V_{gnd})$ since the transistor at whose source terminal the higher potential is adjacent (in this example, the potential $V_{vm}$ at the transistor in cell $Z_{n+1,k}$) is operated with a lower gate-source voltage than the other transistor and, therefore, has a somewhat higher resistance.

Referring to FIG. 2, for the described exemplary embodiment, the medium potential $V_{BL}(0,0)=V_{gnd}+\beta(V_{vm}-V_{gnd})$ is graphically entered in a diagram as both a function of $V_{vm}(=V_{gnd}+\alpha(V_{DD}-V_{gnd}))$ and a function of α for $V_{DD}=V_{wl}=V_{gnd}+5$ V. The embodiment considers two transistors with a channel length of 0.8 μm and an oxide thickness $t_{ox}=20$ nm (technology data: 0.8 μm 5 V CMOS process, $t_{ox}=20$ nm).

FIG. 3 shows a graphical diagram of the factor β as both a function of $V_{vm}(=V_{gnd}+\alpha(V_{DD}-V_{gnd}))$ and as a function of α. For a between 0.3 and 0.6, β lies approximately between 0.3 and 0.45.

Accordingly, specifically valid in this exemplary embodiment, are:

$V_{BL}(0,0)=V_{gnd}+\beta(V_{vm}-V_{gnd})$ with $\beta$ between 0.3 and 0.45, $V_{BL}(1,0)=V_{vm}$, $V_{BL}(0,1)=V_{gnd}$, and $V_{BL}(1,1)=V_{pc}$.

Somewhat more generally, given the employment of n-channel field effect transistors and the allocation of the "0" and the "1" undertaken here, the following are also valid:

$V_{BL}(0,1)<V_{BL}(0,0)<V_{BL}(1,0)<V_{BL}(1,1)$, and, $V_{BL}(1,0)<V_{BL}(0,0)<V_{BL}(0,1)<V_{BL}(1,1)$, given a different selection of the potentials.

Referring back to FIG. 1, at the point in time at which the evaluation of the potential $V_{BL}$ ultimately adjacent the bit line to be read is to occur, this bit line is connected by switch $S_{n,read}$ to the input E of an evaluation circuit AWS whose job is to convert the value of the potential into a binary 2-bit signal at the outputs $A_i$, l=1,2.

When the potential $V_{wl}$ is applied to the gate terminals of a row of transistors, a lower gate-source voltage $(V_{wl}-V_{vm})$ and a lower drain-source voltage $(V_{pc}-V_{vm})$ or a higher gate-source voltage $(V_{wl}-V_{gnd})$ and a higher drain-source voltage $(V_{pc}-V_{gnd})$ are adjacent, in alternation, to the transistors from column to column. Given the employment of identical transistors, the compensation of the greater difference in potential between source and drain therefore occurs at a higher gate-source voltage and, therefore, lower resistance. The discharge of the bit line selected for the readout of two cells therefore occurs via a conductive transistor with approximately the same speed in each of the adjoining columns.

When, for a farther-reaching optimization, the transistors should be matched to the different potentials employed, field effect transistors with somewhat different properties, particularly different threshold voltages, can be utilized, alternating column-by-column. Upon readout, a defined and predetermined potential ($V_{gnd}$ or, as in the described example, $V_{vm}$) is applied to the source terminals of the transistors in an even-numbered column; the value of this potential being low enough to make these transistors in the cells a logical "0," conductive upon application of the potential $V_{wl}$ to the gate terminals. A specific, different predetermined potential ($V_{vm}$ or, as in the described example, $V_{gnd}$) is respectively applied to the source terminals of the transistors in an odd-numbered column; the value of this potential being low enough to correspondingly make these transistors in the cells a logical "0," conductive when the potential $V_{wl}$ is adjacent the gate terminals.

Instead of n-channel field effect transistors, p-channel field effect transistors can be employed. In such a case, the bit line provided for the readout of cells is precharged to a low potential. The potentials applied to the source terminals differ in alternation, column-by-column, and are higher at least by the threshold voltage than the gate potential $V_{wl}$ for the selection of a row. It is only a matter of principle that controllable resistors are present in the cells (at least in those with a "0"). These resistors enable an adequate flow of current between a first and a second terminal when a potential with a specific value, or a value in a specific interval, is pending at a third terminal of this resistor. Otherwise, these resistors reduce or inhibit the flow of current. Potentially, as in the case of field effect transistors, the difference in potential between the third terminal and one of the two other terminals of the controllable resistor is to be taken into consideration.

For a numbering of the columns (increasing or decreasing from left to right and beginning with an arbitrary number), it is sufficient when the controllable resistors utilized in the cells have certain properties. First of all, all of these resistors that are arranged in even-numbered columns are of such a nature that, when a first predetermined potential is applied to the first terminal of such a resistor, and a second predetermined potential is applied to the second terminal thereof and a third predetermined potential is applied to the third terminal thereof, the resistance is so low between the first and the second terminal that a compensation of the difference in potential between the first and the second terminal occurs within a time provided for a read event. Further, when this first predetermined potential is adjacent the first terminal, the second predetermined potential is adjacent the second terminal and a fourth predetermined potential is adjacent at the third terminal, the resistance is so high between the first and the second terminal that the difference in potential between the first terminal and the second terminal is essentially preserved during this time provided for a read event.

Second of all, all those resistors that are arranged in odd-numbered columns are of such a nature that, when the first predetermined potential is adjacent the first terminal of such a resistor, and a fifth predetermined potential differing from the second predetermined potential is adjacent the second terminal thereof and the third predetermined potential is adjacent the third terminal thereof, the resistance is so low between the first and the second terminal that a compensation of the difference in potential between the first and the second terminal occurs within a time provided for a read event. In addition, when this first predetermined potential is adjacent the first terminal, and the fifth predetermined potential is adjacent the second terminal and the fourth predetermined voltage is adjacent the third terminal, the resistance is so high between the first and the second terminal that the difference in potential between the first terminal and the second terminal is essentially preserved during this time provided for a read event.

In accordance with the present invention, it is also possible to provide only every second bit line for the readout. In such an embodiment, the switches can be configured so that, basically, every existing bit line can be selected for the readout of two adjoining cells, i.e. can be precharged to the first predetermined potential ($V_{pc}$ in the example shown in FIG. 1). The neighboring bit lines are then applied to the second potential ($V_{gnd}$ in the example) or, respectively, to the fifth potential ($V_{vm}$ in the example). This assumes, however, that the controllable resistors are symmetrical enough to enable the described functioning in both directions between the first and second terminals.

Figure 5:
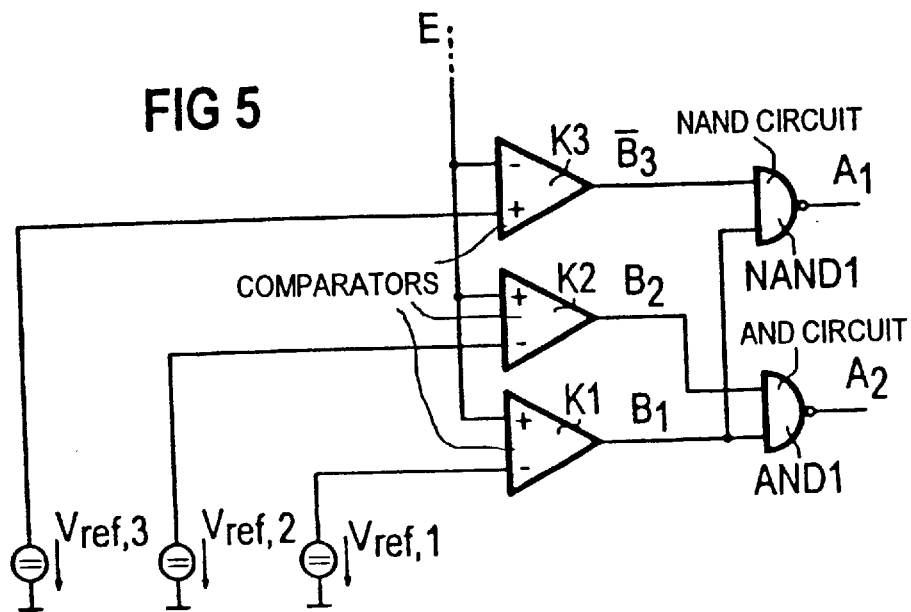
FIG. 5 shows a schematic diagram of an alternative embodiment of an evaluation circuit in accordance with the principles of the present invention.

FIGS. 4 and 5 schematically show circuits with which the complete evaluation circuit AWS may be constructed. In order to convert the result of a read event, which is present as potential at the bit line selected for the readout, into binary signals that can be further processed, three comparators K1, K2 and K3 can be utilized as in FIG. 4. This circuit first supplies a 3-bit signal. All non-inverting inputs of these three comparators are connected to one another to form the input E of the evaluation circuit AWS (see FIG. 1). Input E is connected via a data line to all other switches $S_{n,read}$.

The inverting inputs of the comparators are applied to the reference potentials $V_{ref,1}$, $V_{ref,2}$, $V_{ref,3}$. These reference potentials are selected so that one such potential lies between two successive potentials on the particular bit line resulting from the read event. That is:

$V_{BL}(0,1) < V_{ref,1} < V_{BL}(0,0) < V_{ref,2} < V_{BL}(1,0) < V_{ref,3} < V_{BL}(1,1)$ or, given a different selection of the potentials, $V_{BL}(1,0) < V_{ref,1} < V_{BL}(0,0) < V_{ref,2} < V_{BL}(0,1) < V_{ref,3} < V_{BL}(1,1)$.

In the example with $V_{BL}(0,0)=V_{gnd}+\beta(V_{vm}-V_{gnd})$ ($\beta$ between 0.3 and 0.45), $V_{BL}(1,0)=V_{vm}$, $V_{BL}(0,1)=V_{gnd}$ and $V_{BL}(1,1)=V_{pc}$, $V_{ref,1}$, $V_{ref,2}$, $V_{ref,3}$ are preferably selected, for example, as follows:

$V_{ref,1} \approx V_{gnd} + 0.5\beta(V_{vm} - V_{gnd}) \leq V_{gnd} + 0.225(V_{vm} - V_{gnd})$,
$V_{ref,2} \approx V_{gnd} + \beta(V_{vm} - V_{gnd}) + 0.5(V_{vm} - V_{gnd} - \beta(V_{vm} - V_{gnd})) = V_{gnd} + 0.5(1 + \beta)(V_{vm} - V_{gnd}) \leq V_{gnd} + 0.725(V_{vm} - V_{gnd})$,
$V_{ref,3} \approx V_{gnd} + 1.25(V_{vm} - V_{gnd}) \leq V_{gnd} + 0.75(V_{DO} - V_{gnd})$.

In this way, the reference potentials $V_{ref,1}$ and $V_{ref,2}$ are respectively placed exactly between the values $V_{BL}(0,1)$ and $V_{BL}(0,0)$ or, respectively, between the values $V_{BL}(0,0)$ and $V_{BL}(1,0)$. It was assumed in the selection of $V_{ref,3}$ that the condition $V_{pc} > V_{gnd}+1.25(V_{vm}-V_{gnd})$ is met, preferably $V_{pc} > V_{gnd}+1.5(V_{vm}-V_{gnd})$, which is valid under the conditions $V_{pc}=V_{DD}$ and $V_{vm}=V_{gnd}+\alpha(V_{DD}-V_{gnd})$ with $\alpha$ at least 0.3 and at most 0.6. If these conditions are not met in other embodiments, which can happen when the selection of a precharging potential $V_{pc} < V_{DD}$ or when the factor $\alpha$ is selected outside of the recited range, then $V_{ref,3}$ is preferably placed exactly between the value of $V_{BL}(1,1)$ and the larger of the values of $V_{BL}(0,1)$ and $V_{BL}(1,0)$.

Deriving as an example for the case $V_{pc}=V_{DD}=V_{gnd}+5$ V and $\alpha=0.5$:

$V_{vm}=V_{gnd}+2.5$ V and $\beta=0.36$ and, therefrom, $V_{BL}(0,1)=V_{gnd}$, $V_{BL}(0,0)=V_{gnd}+0.9$ V, $V_{BL}(1,0)=V_{gnd}+2.5$ V and $V_{BL}(1,1)=V_{gnd}+5$ V, as well as $V_{ref,1}=V_{gnd}+0.45$ V, $V_{ref,2}=V_{gnd}+1.7$ V and $V_{ref,3}=V_{gnd}+3.75$ V.

The binary values $B_1$, $B_2$, and $B_3$ (corresponding to a low or high potential) recited in the following table derive at the outputs $B_1$, $B_2$, and $B_3$ of the circuit according to FIG. 4 depending upon the values of the Boolean variables $Z_{n,k}$ and $Z_{n+1,k}$ allocated to the cells $Z_{n,k}$ and $Z_{n+1,k}$.

| $Z_{n,k}$ | $Z_{n+1,k}$ | $B_1$ | $B_2$ | $B_3$ |
|---|---|---|---|---|
| 1 | 1 | 1 | 1 | 1 |
| 1 | 0 | 1 | 1 | 0 |
| 0 | 1 | 0 | 0 | 0 |
| 0 | 0 | 1 | 0 | 0 |

The following logical expressions for the informational content of the cells can be directly read from this table:

$Z_{n,k}=B_1 \hat{} B_2$ and $Z_{n+1,k}=\bar{B}_1 \vee B_3 = \overline{\bar{B}_1 \hat{} B_3}$ FIG. 5 offers an expansion of the circuit shown in FIG. 4 which supplies the desired 2-bit signal at the outputs $A_1$ and $A_2$ with the informational content of the cells $Z_{n,k}$ (at output $A_2$) and $Z_{n+1,k}$ (at output $A_1$). The logical expressions for $Z_{n,k}$ and $Z_{n+1,k}$ are thereby generated according to the above equations with the assistance of logic gates. The signal $Z_{n+1,k}$ is generated with the assistance of the NAND gate NAND1. At the comparator K3, the terminals of the non-inverting input and the terminals of the inverting input have been interchanged with one another in contrast to that which is shown in FIG. 4. The required signal, therefore, is directly available at the input of the comparator K3 and at one of the two inputs of the NAND gate NAND1. $Z_{n,k}$ is realized by an AND operation of the signals $B_1$ and $B_2$ with the assistance of the AND gate AND1.

The read event was presented in conjunction with the above-described exemplary embodiment of an inventive matrix memory such that the potential $V_{wl}$ is only applied to the selected word line by closing the switch $S'_{k,vwl}$ when the procedure of precharging the bit line to the potential $V_{pc}$ has ended, i.e. when the switch $S_{n,pc}$ is opened or when the further switch $S_{n,read}$ is closed. Instead, the potential $V_{wl}$ can also be applied to the selected word line when the potential $V_{pc}$ is applied to the selected bit line. This results in the bit line being not completely charged when at least one cell that contains a logical "0" is present in the selected row neighboring this bit line. The procedure of discharging the bit line that occurs after the end of the precharging of the bit line as described above thus requires a shorter amount of time. Accordingly, the entire read event occurs in a shorter amount of time since the value (level) of the potential to be evaluated at the bit line selected for the readout is reached faster. The input E of the evaluation circuit AWS can already be connected to the bit line during the precharging of this selected bit line. Other possible modifications of the inventive matrix memory and of the pertinent read event derive from the basic functionality as described with reference to the examples.

We claim as our invention:

1. A matrix memory with memory cells that are arranged in rows and columns and that are provided for storing a logical "0" or "1", comprising:

a plurality of variable resistance resistors, each resistor arranged in one of the memory cells that stores a logical "0", each resistor also having a first, a second and a third terminal, wherein for a sequential numbering of the columns, each resistor that is arranged in an even-numbered column (even-column resistor) is characterized in that, when a first predetermined potential is applied to the first terminal of the even-column resistor and when a second predetermined potential is applied to the second terminal and when a third predetermined potential is applied to the third terminal, a resistance of the even-column resistor is so low between the first terminal and the second terminal that a compensation of the difference in potential between the first terminal and the second terminal occurs within a time provided for a read event, and wherein each even-column resistor is further characterized in that, when the first predetermined potential is adjacent the first terminal and the second predetermined potential is adjacent the second terminal and a fourth predetermined potential is adjacent the third terminal, the resistance of the even-column resistor is so high between the first terminal and the second terminal that the difference in potential between the first terminal and the second terminal is substantially preserved during the time provided for a read event, and wherein each resistor that is arranged in an odd-numbered column (odd-column resistor) is characterized in that, when the first predetermined potential is adjacent a first terminal of the odd-column resistor and when a fifth predetermined potential differing from the second predetermined potential is adjacent the second terminal and when the third predetermined potential is adjacent the third terminal, the resistance of the odd-column resistor is so low between the first terminal and the second terminal that a compensation of the difference in potential between the first terminal and the second terminal occurs within the time provided for a read event, and wherein each odd-column resistor is further characterized in that, when the first predetermined potential is adjacent the first terminal and when the fifth predetermined potential is adjacent the second terminal and when the fourth predetermined voltage is adjacent the third terminal, the resistance of the odd-column resistor is so high between the first terminal and the second terminal that the difference in potential between the first terminal and the second terminal is substantially preserved during the time provided for a read event;

a plurality of first bit lines, wherein for each pair of columns composed of an odd-numbered column and a following even-numbered column (first pair), each first bit line electrically connecting together the first terminals of all resistors in the first pair;

a plurality of second bit lines, wherein for each pair of columns composed of an even-numbered column and a following odd-numbered column (second pair), each second bit line electrically connecting together the second terminals of all resistors in the second pair;

a plurality of word lines, each word line electrically connecting together the third terminals of all the resistors in one row;

a plurality of first switches by which the bit lines may be connected to the first predetermined potential or the second predetermined potential or the fifth predetermined potential, wherein the first predetermined potential may be applied to the first terminals of the resistors in the first pairs, wherein the second predetermined potential may be applied to the second terminals of the resistors in the even-numbered columns of the second pairs, and wherein the fifth predetermined potential may be applied to the second terminals of the resistors in the odd-numbered columns of the second pairs;

a plurality of second switches by which the word lines may be connected to the fourth predetermined potential and by which one of the word lines may be connected to the third predetermined potential; and a plurality of third switches by which a bit line may be connected to an evaluation circuit.

2. The matrix memory as claimed in claim 1, further comprising field effect transistors as the variable resistance resistors, wherein the first terminals are drain terminals of the field effect transistors, the second terminals are source terminals of the field effect transistors and the third terminals are gate terminals of the field effect transistors.

3. The matrix memory as claimed in claim 2, further comprising n-channel MOSFETs as the field effect transistors, wherein the third predetermined potential lies above the second predetermined potential at least in the spacing of a highest threshold voltage of the field effect transistors in the even-numbered columns, and wherein the third predetermined potential lies above the fifth predetermined potential at least in the spacing of a highest threshold voltage of the field effect transistors in the odd-numbered columns.

4. The matrix memory as claimed in claim 2, further comprising p-channel MOSFETs as the field effect transistors, wherein the third predetermined potential lies below the second predetermined potential at least in the spacing of a highest threshold voltage of the field effect transistors in the even-numbered columns, and wherein the third predetermined potential lies below the fifth predetermined potential at least in the spacing of a highest threshold voltage of the field effect transistors arranged in the odd-numbered columns.

5. The matrix memory as claimed in claims 1, further comprising a grounded potential (ground) as both the second predetermined potential and the fourth predetermined potential.

6. The matrix memory as claimed in claims 1, further comprising a grounded potential (ground) as both the fifth predetermined potential and the fourth predetermined potential.

7. The matrix memory as claimed in claim 5, further comprising a difference in potential between the second predetermined potential and the fifth predetermined potential which is at least 0.3 times and at most 0.6 times the greater of either the difference in potential between the first predetermined potential and the second predetermined potential or the difference in potential between the first predetermined potential and the fifth predetermined potential.

8. The matrix memory as claimed in claim 6, further comprising a difference in potential between the second predetermined potential and the fifth predetermined potential which is at least 0.3 times and at most 0.6 times the greater of either the difference in potential between the first predetermined potential and the second predetermined potential or the difference in potential between the first predetermined potential and the fifth predetermined potential.

9. The matrix memory as claimed in claim 1, further comprising a first comparator, a second comparator and a third comparator in the evaluation circuit, wherein one input of the first comparator is connected to a first reference potential, one input of the second comparator is connected to a second reference potential and one input of the third comparator is connected to a third reference potential, and wherein other inputs of the three comparators are electrically connected to one another and to the plurality of third switches, and wherein the first reference potential lies between the second potential and a medium potential that is adjacent the first terminals of the resistors connected to one another in an odd-numbered column and the following even-numbered column when the second predetermined potential is adjacent the second terminals of the resistors in the even-numbered column, the fifth predetermined potential is adjacent the second terminals of the resistors in the odd-numbered column and the third predetermined potential is adjacent the third terminals of at least one of the resistors that is arranged in the even-numbered column and at least one of the resistors that is arranged in the odd-numbered column, and wherein the second reference potential lies between the fifth predetermined potential and the medium potential, and wherein the third reference potential lies between the first predetermined potential and the second predetermined potential and between the first predetermined potential and the fifth predetermined potential.

10. The matrix memory as claimed in claim 9, further comprising two logic gates, the logic gates having inputs particularly connected to outputs of the three comparators such that informational content in one of two simultaneously read memory cells is represented at outputs of these gates as low or high potential.

11. The matrix memory as claimed in claim 8, further comprising an AND gate and a NAND gate as the two logic gates, wherein an inverting input of the first comparator is connected to the first reference potential, an inverting input of the second comparator is connected to the second reference potential, a non-inverting input of the third comparator is connected to the third reference potential, outputs of the first comparator and of the second comparator are connected to inputs of the AND gate, and outputs of the first comparator and of the second comparator are connected to inputs of the NAND gate.

* * * * *